United States Patent [19]
Jeng

[11] Patent Number: 5,658,830
[45] Date of Patent: Aug. 19, 1997

[54] METHOD FOR FABRICATING INTERCONNECTING LINES AND CONTACTS USING CONFORMAL DEPOSITION

[75] Inventor: Erik S. Jeng, Taipei, Taiwan

[73] Assignee: Vanguard International Semiconductor Corporation, Hsinchu, Taiwan

[21] Appl. No.: 679,198

[22] Filed: Jul. 12, 1996

[51] Int. Cl.$^6$ .................................. H01L 21/44
[52] U.S. Cl. .............. 438/620; 438/633; 438/638; 438/639; 438/672
[58] Field of Search .................... 437/195, 189, 437/192, 203, 228 SW, 228 TR; 448/DIG. 50

[56] References Cited

U.S. PATENT DOCUMENTS

| | | | |
|---|---|---|---|
| 4,936,950 | 6/1990 | Doan et al. | 437/203 |
| 5,200,030 | 4/1993 | Cho et al. | 437/203 |
| 5,266,446 | 11/1993 | Chang et al. | 437/203 |
| 5,316,978 | 5/1994 | Boyd et al. | 437/203 |
| 5,460,987 | 10/1995 | Wen et al. | 437/203 |
| 5,474,651 | 12/1995 | Huebner | 437/203 |
| 5,484,747 | 1/1996 | Chien | 437/192 |
| 5,498,566 | 3/1996 | Lee | 148/DIG. 50 |
| 5,536,625 | 7/1996 | Bohr | 148/DIG. 50 |

*Primary Examiner*—Kevin Picardat
*Attorney, Agent, or Firm*—Christensen O'Connor Johnson & Kindness, PLLC

[57] ABSTRACT

The present invention is a method for fabricating interconnecting lines and contacts using conformal deposition. This invention applies patterning trenches simultaneously for interconnecting lines and contact holes and forming spacers technologies to make fully filled interconnecting line and contact holes. Then, utilizing the conformal deposition and blanket etch-back etching method, the present invention can fabricating interconnecting lines and contacts simultaneously.

22 Claims, 4 Drawing Sheets

METHOD FOR FABRICATING INTERCONNECTING LINES AND CONTACTS USING CONFORMAL DEPOSITION

FIELD OF THE INVENTION

The present invention relates to interconnect technology in semiconductor processing and, more particularly, to a method of fabricating interconnecting lines and contacts.

BACKGROUND OF THE INVENTION

In conventional processes, the method of making contacts and interconnecting lines in integrated circuits typically includes at least the following two mainly sequential steps: (1) the formation of the contact holes, and (2) the formation of the interconnecting line patterning. More specifically, a typical conventional procedure includes five main process steps: (1) contact holes photolithography, (2) contact holes etch, (3) film deposition, (4) interconnecting lines photolithography, and (5) interconnecting lines etch. FIGS. 1–5 illustrate a conventional method of making contacts and interconnecting lines.

FIG. 1 shows the cross-section of an intermediate structure in forming a contact and interconnect line. Using conventional processes, a patterned photoresist layer 14 is formed on a dielectric layer 10 that covers a conductive area 12. Typically, dielectric layer 10 is an oxide layer or a borophosphosilicate glass (BPSG) layer. The conductive area 12 is formed on the bottom of the dielectric layer 10. The conductive area 12 is either a source/drain region or polysilicon gate electrode. The photoresist layer 14 is patterned for making a contact hole in the dielectric layer 10 to the conductive area 12.

FIG. 2 shows the cross-section of the structure after a contact hole 13 is formed by etching. More specifically, the portions of the dielectric layer 10 left uncovered by the photoresist layer 14 is anisotropically etched and the photoresist layer 14 is removed. Thus, a contact hole 13 is formed, thereby exposing the conductive area 12.

FIG. 3 shows the cross-section of the structure after depositing a conductive layer 16 on the dielectric layer 10 and conductive area 12. Typically, a metal, such as aluminum, is deposited by chemical vapor deposition (CVD) in this step. In general, it is preferrable that when depositing the conductive layer 16, the conductive material entirely fill the contact hole 13. Depending on the aspect ratio of the contact hole 13, the step coverage may be relatively poor.

FIG. 4 shows the cross-section of the structure after a second photoresist layer 18 is patterned on the conductive layer 16. The photoresist region 18A forms a mask for making an interconnect line, and the photoresist region 18B forms a mask for making a contact.

FIG. 5 shows the cross-section of the structure after an interconnect line 21 and a contact 20 are formed. To form the interconnecting line 21 and the contact 20, an anisotropic etch is performed to etch the conductive layer 16 left uncovered by photoresist regions 18A and 18B. Then the photoresist regions 18A and 18B are removed in a conventional manner.

There are three main problems with these conventional processes. First, the interconnecting lines patterning is susceptible to under-cut and sidewall corrosion during the etching process. Second, the formation of the contact is susceptible to nonconformal step coverage at the opening of the contact hole. The third problem is the interface problem between the contact plugs and interconnecting lines. The applicants are not aware of any conventional methods to solve the second and third problems. Typically, manufacturers try to control the reaction conditions in order to minimize the interface and nonconformal step coverage problem. In response to the first problem, traditionally, cleaning steps are required after etching, but these cleaning steps make the fabrication process more complex and generates the other problems.

SUMMARY OF THE INVENTION

In accordance with the present invention, a method for fabricating interconnecting lines and contacts with a single photoresist step and conformal deposition is disclosed. In one embodiment of this method, a dielectric layer is formed over a conductive area for which a contact is to be formed. A first conductive layer is formed over the dielectric layer. The first conductive layer is patterned to form a first trench and a second trench using a single photoresist step. The first trench is used to form an interconnect line and is relatively narrow. The second trench is used to form the contact to the conductive area and is relatively wide compared to the first trench.

Next, a conformal second conductive layer is formed over the first conductive layer and in the first and second trenches. Because the first trench is narrow, the conformal second conductive layer substantially fills the first trench in constrast, because the second trench is wide, the conformal second conductive layer conforms to the sidewalls and does not fill the second trench. The conformal second layer is then etched back with an anisotropic etching process. Because the first trench is substantially filled, the etchback does not expose the bottom of the first trench. In contrast, because the second conductive layer is conformal in the second trench, the etchback forms spacers on the sidewalls and exposes a portion of the bottom of the second trench.

Afterward, a selective etching step is performed to etch the portion of the dielectric layer exposed in the second trench. The spacers in the second trench are used a hard mask for the selective etch of the exposed dielectric layer. The selective etching step forming a contact hole through the dielectric layer to the conductive area. A third conductive layer is then deposited to fill the contact hole. Then a blanket anisotropic etchback step or chemo-mechanical polishing step is performed down to the top surface of the dielectric layer, thereby removing the portions of the first, second and third conductive layers extending above the top surface of the dielectric layer. As a result, an interconnect line is formed with a single photoresist step in the first trench with substantially no sidewall corrosion. Simultaneously, a contact and a corresponding interconnect line is formed in the second trench with substantially no sidewall corrosion, reduced interface problems, and improved step coverage.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
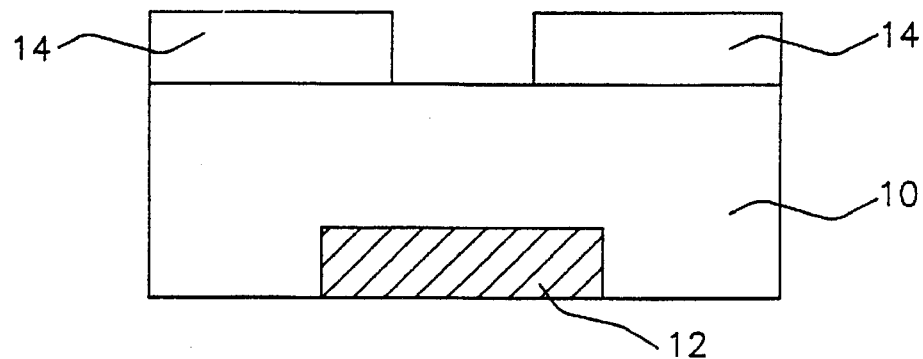
FIGS. 1–5 schematically illustrate cross-sectional views of the structure formed at various stages in fabricating contacts and interconnecting lines using conventional processes.
Figure 2:
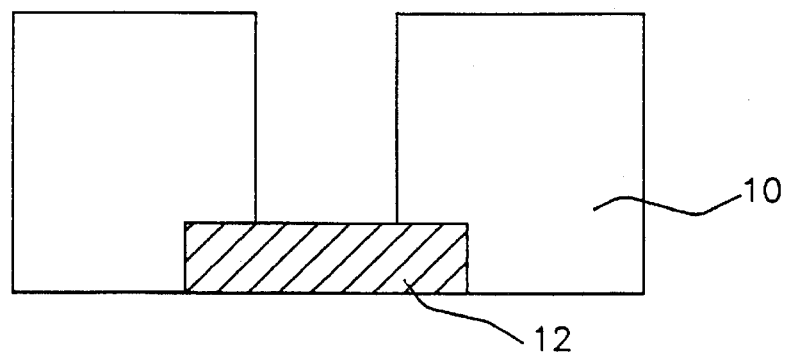
Figure 3:
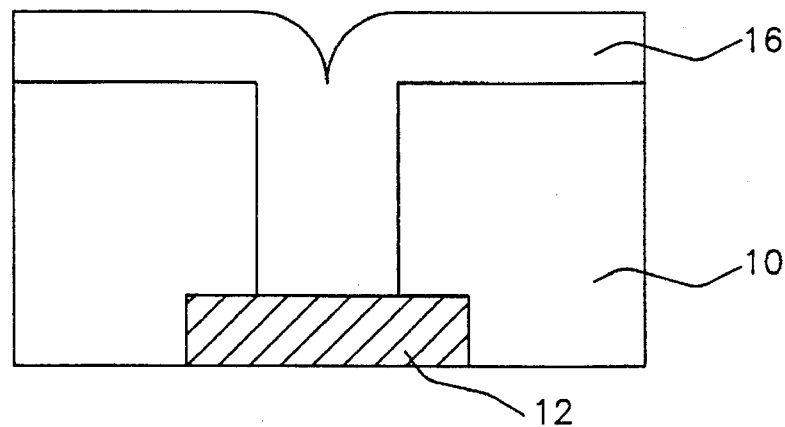
Figure 4:
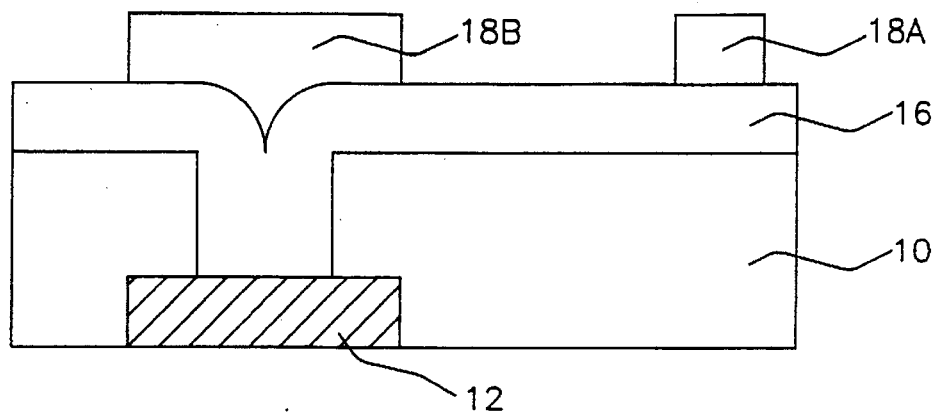
Figure 5:
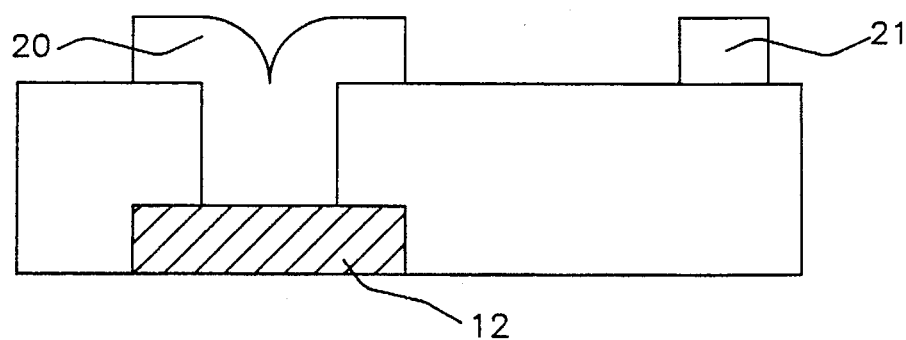
Figure 6:
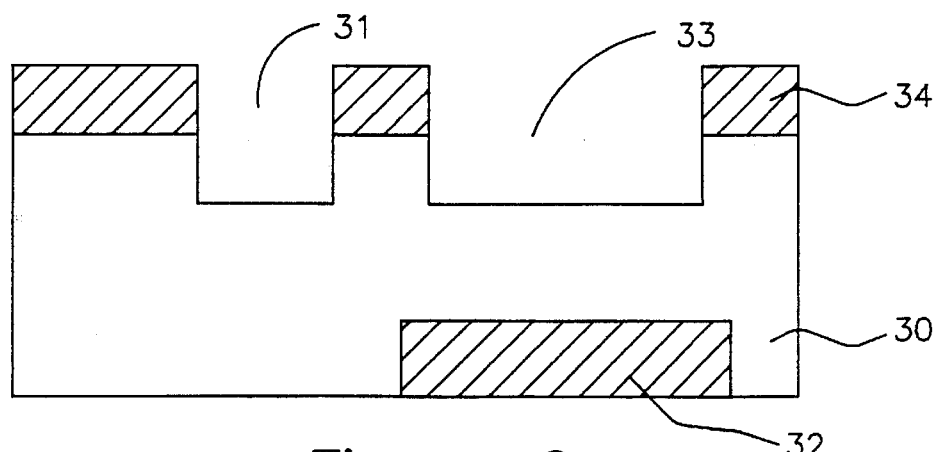
FIGS. 6–10 schematically illustrate cross-sectional views of the structure formed at various stages in fabricating contacts and interconnecting lines in accordance with one embodiment of the present invention.

A method of fabricating interconnecting lines and contacts using conformal deposition according to the present invention is described herein. FIG. 6 shows a cross-sectional view of an initial stage of fabricating an interconnect line and a contact in accordance with one embodiment of the present invention. Using conventional techniques, a dielectric layer 30 is formed over a conductive region 32 for which a contact is to be fabricated. Preferrably, the dielectric layer 30 has a substantially planar top surface. The dielectric layer 30 can be made of any suitable dielectric material such as, for example, oxide or borophosphosilicate glass (BPSG) having a thickness of about 4500 angstroms, although any thickness in the range of 3000–9000 angstroms can be used. In this embodiment, the conductive area 32 is a polysilicon gate electrode, although the conductive area can be a source/drain region in other embodiments.

A first conductive layer 34 having a thickness of about 2000 angstroms is then formed on the dielectric layer 30. The conductive layer can be any conductive material suitable for forming interconnect lines and contacts. For example, the first conductive layer 34 may include polysilicon or tungsten deposited by CVD, or aluminum deposited by sputtering. Preferrably, the conductive layer 34 has a planar top surface. Two trenches 31 and 33 are then formed using conventional photolithographic and etching techniques through the first conductive layer 34 and extending into the dielectric layer 30. Thus, a single photoresist step is used to pattern the trenches 31 and 33. As a result, unlike the aforementioned conventional method, the patterning of the interconnect line and the contact is accomplished in one photoresist step.

The trench 31 has a width of about 0.4 μm, although any width in the range 0.1–1 μm can be used. The trench 31 will be used to form an interconnect line as described below in conjunction with FIGS. 7A–10. In contrast, the trench 33 has a width of about 0.71 mm, although any width in the range 0.3–1.3 μm can be used. However, the trench 33 must be wide enough so that a second conductive layer can be deposited conformally in the trench, as described below in conjunction with FIG. 7A.

Figure 7A:
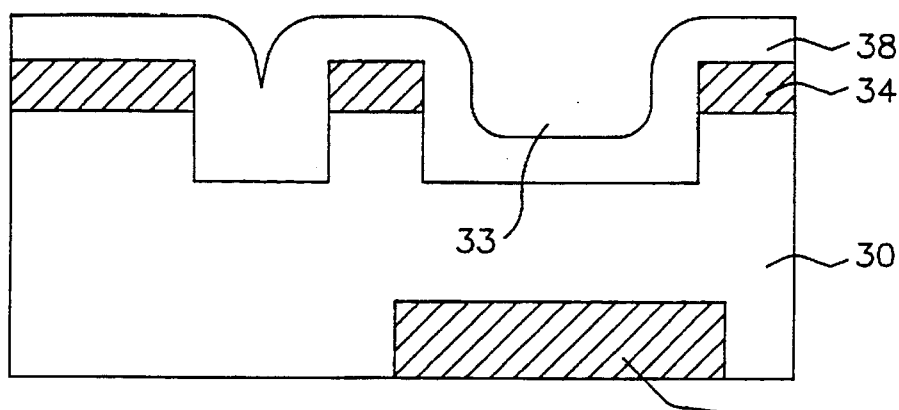

FIG. 7A shows the cross-section of an intermediate structure in the fabrication of an interconnect line and contact according to one embodiment of the present invention. A second conductive layer 38 is conformally formed on the first conductive layer 34 and within the trenches 31 and 33. In one embodiment, the second conductive layer 38 is formed by CVD of polysilicon. Alternatively, the second conductive layer 38 may be tungsten deposited using CVD. Any suitable conductive material and deposition method can be used, provided the second conductive layer 38 can be formed conformally within the trench 33 but substantially filling the narrower trench 31, as shown in FIG. 7A.

Figure 7B:
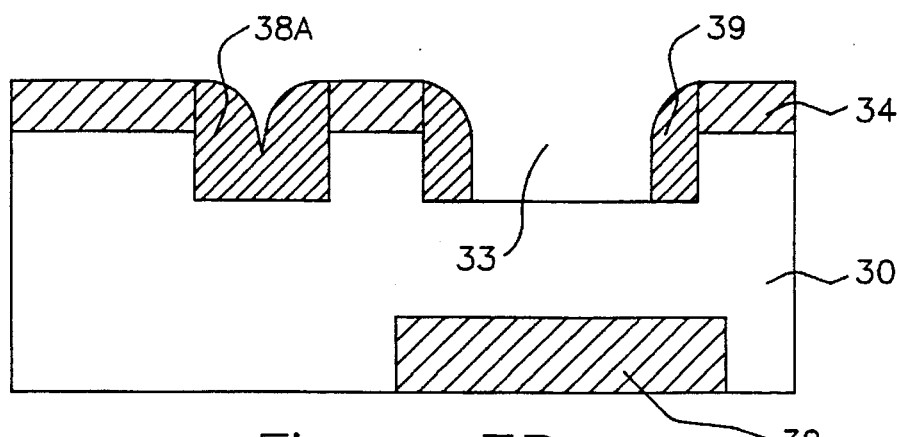

FIG. 7B shows the cross-section of a next intermediate structure in the fabrication of an interconnect line and contact according to one embodiment of the present invention. A conventional anisotropic etching step is performed on the structure shown in FIG. 7B. As a result, the second conductive layer 38 (FIG. 7A) is partially etched to expose the top surface of the first conductive layer leaving a thinner second conductive layer 38A within the trench 31. In addition, this etching step also forms a spacer 39 on the sidewall of the trench 33. In contrast, because the trench 31 was substantially filled with the second conductive layer 38, the bottom of the trench 31 remains sealed (i.e., the bottom of the trench 31 remains unexposed) after this etching step. The spacer 39 is used as a hard mask in etching a contact hole as described below in conjunction with FIG. 8. In addition, because the spacer 39 is conductive, it helps prevent nonconformal step coverage at the opening of Contact hole, after a subsequent etching step (described in conjunction with FIG. 10).

Figure 8:
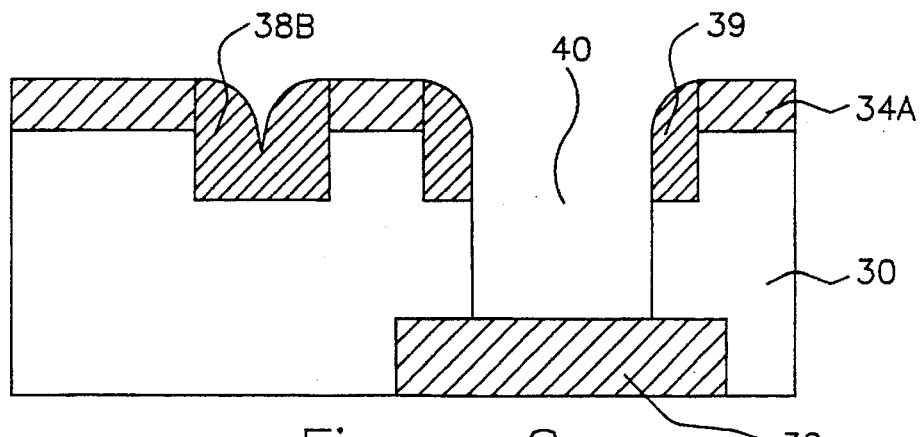

FIG. 8 shows the cross-section of the structure after a contact hole 40 is formed. The contact hole 40 is formed by etching the dielectric layer 30 left uncovered by the hard mask formed by the spacer 39 and the remaining portions of the first and second conductive layers 34 and 38A (FIG. 7B). A conventional selective etching process is used, with the conductive region 32 serving as an etch stop. This etching process reduces the thickness of the first and second second conductive layers 34 and 38A (FIG. 7B) to form first conductive layer 34A second conductive layer 38B. The resulting structure is shown in FIG. 8.

Figure 9:
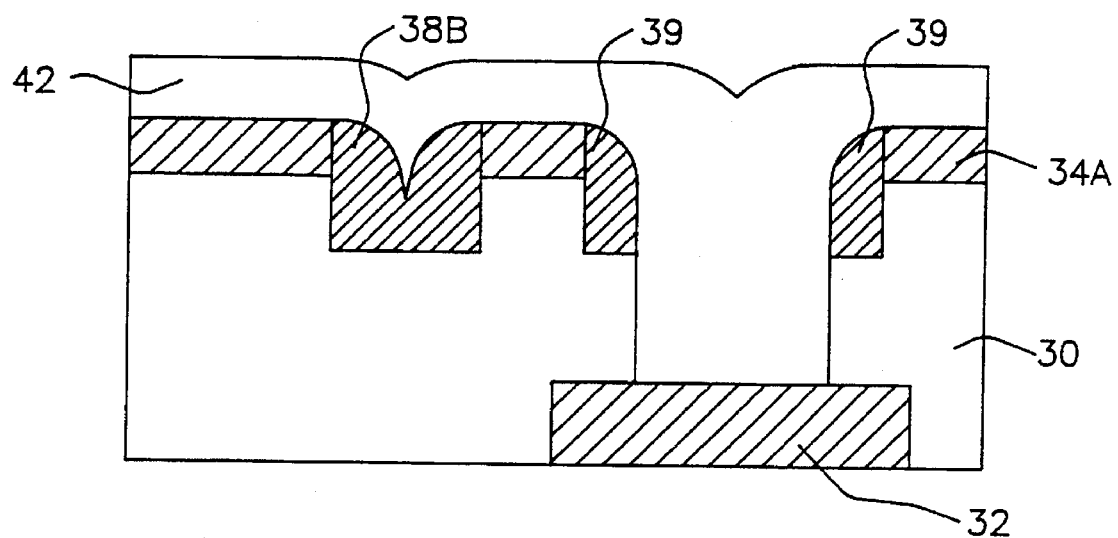

FIG. 9 shows a cross-section of a next intermediate structure in fabricating interconnect lines and contacts according to one embodiment of the present invention. A third conductive layer 42 is formed having a nominal thickness of about 3000 angstroms on the structure shown in FIG. 8. The third conductive layer 42 is formed by conformal deposition of silicide using a CVD process. Because a conformal deposition is used, the contact hole 40 is substantially completely filled. In addition, the third conductive layer fills any cavity in the second conductive layer in the trench 31. The resulting structure is shown in FIG. 9.

Figure 10:
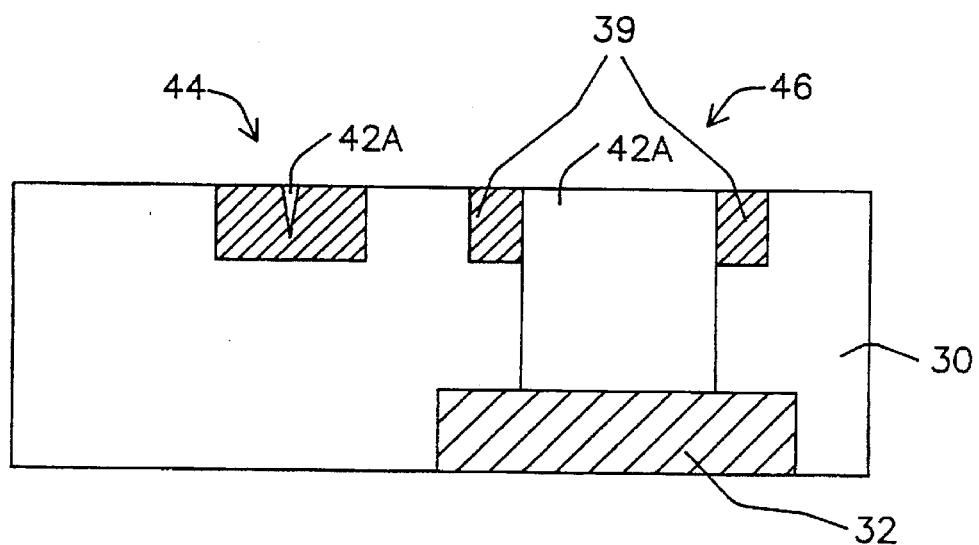

FIG. 10 shows cross-section of a interconnect line 44 and contact 46 fabricated in accordance with one embodiment of the present invention. The conductive layers 34A, 38A, and 42 are removed using any suitable conventional process. In one embodiment, a blanket etch-back process is used. In another embodiment, chemical-mechanical polishing is used to remove the conductive layers and planarize the structure. As a result, portions 42A of the third conductive layer 42 remain on the structure and have a top surface that is substantially even with the top surface of the dielectric layer 30. Thus, the interconnecting line 44 and the contact 46 are formed. The lower portions of the spacer 39 remains in the structure, thereby helping to prevent the nonconformal step coverage and providing a border for forming a via from a interconnect line in a subsequently formed conductive layer.

Although specific embodiment has been illustrated and described, it will be obvious to those skilled in the art that various modifications may be made without departing from the which is intended to be limited solely by the appended claims.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for fabricating interconnecting lines and contacts in semiconductive device, the method comprising:
    forming a dielectric layer over a conductive area;
    forming a first conductive layer on the dielectric layer;
    forming a first trench and a second trench in the dielectric layer and into the first conductive layer, wherein the first trench is used in forming a contact hole to the conductive area and the second trench is used in forming an interconnect line;

depositing a second conductive layer conformally over the first conductive layer and in the first trench, wherein the first trench is filled by the second conductive layer to a thickness greater than a thickness of the second conductive layer located over a portion of a bottom surface of the first trench;

forming a spacer on a sidewall of the first trench from a portion of the second conductive layer conformally deposited in the first trench, wherein the portion of a bottom surface of the first trench is exposed;

forming a contact hole in the dielectric layer by etching using the spacer as a mask;

forming a third conductive layer on the second conductive layer and in the contact hole, wherein the third conductive area contacts the conductive area; and removing portions of the first, second and third conductive layer so that a top surface of an upper portion of the dielectric layer is exposed.

2. The method according to claim 1, wherein said dielectric layer comprises an oxide layer.

3. The method according to claim 1 wherein the dielectric layer comprises a borophosphosilicate glass (BPSG) layer.

4. The method according to claim 1, wherein forming the first conductive layer comprises depositing conductive material using chemical vapor deposit method.

5. The method according to claim 1, wherein said first conductive layer comprises a metal layer.

6. The method according to claim 1, wherein said first conductive layer comprises a polysilicon layer.

7. The method according to claim 1, wherein said second conductive layer comprises a metal layer.

8. The method according to claim 1, wherein said second conductive layer comprises a polysilicon layer.

9. The method according to claim 1, wherein said third conductive layer comprises a metal layer.

10. The method according to claim 1, wherein said third conductive layer comprises a polysilicon layer.

11. The method according to claim 1, wherein forming the first and second trenches comprises:

depositing and etching a photoresist on said first conductive layer, wherein portions of the photoresist serve as a mask; and etching said first conductive layer and said dielectric layer which are not cover by the mask.

12. The method according to claim 1, wherein the first trench has a greater width than the second trench.

13. The method according to claim 12, wherein the width of the second trench is about 0.4 µm and the width of the first trench is about 0.7 µm.

14. The method according to claim 1, wherein said forming of said second conductive layer comprises forming said second conductive layer by conformal deposition.

15. The method according to claim 1, wherein said forming of said spacer comprises anisotropic etching said second conductive layer.

16. The method according to claim 1, wherein forming a contact hole comprises etching an exposed portion of the dielectric layer in the first trench until the conductive area is exposed, said first conductive layer and said spacer serving as an etch mask.

17. The method according to claim 1, wherein the etching comprises using a selective etch process with a selectivity ratio of about 5:1 for the dielectric layer to the first conductive layer.

18. The method according to claim 1, wherein said forming of said third conductive layer comprises forming said third conductive layer by conformal deposition.

19. The method according to claim 1, wherein said removing of the portion of the third conductive layer comprises a blanket etch-back process.

20. The method according to claim 1, wherein said removing of the portion of the first, second, and third conductive layer comprises removing the portion of the first, second, and third conductive layer by chemical mechanical polishing.

21. The method according to claim 19, wherein the end-point of the blanket etchback process is said dielectric layer.

22. A method for fabricating contacts in semiconductive device, the method comprising:

forming a dielectric layer over a conductive area;

forming a first conductive layer on the dielectric layer;

forming a first trench and in the dielectric layer and through the first conductive layer, wherein the first trench is used in forming a contact hole to the conductive area;

depositing a second conductive layer conformally over the first conductive layer and in the first trench;

forming a spacer on a sidewall of the first trench from a portion of the second conductive layer conformally deposited in the first trench, wherein a portion of a bottom surface of the first trench is exposed;

forming a contact hole in the dielectric layer by etching using the spacer as a mask;

forming a third conductive layer on the second conductive layer and in the contact hole, wherein the third conductive area contacts the conductive area; and removing portions of the first, second and third conductive layer so that a top surface of an upper portion of the dielectric layer is exposed.

\* \* \* \* \*